(12) United States Patent
Markman

(10) Patent No.: US 8,885,663 B2
(45) Date of Patent: Nov. 11, 2014

(54) DATA BLOCK PROCESSOR IN A MOBILE DTV SYSTEM WITH DIVERSITY

(75) Inventor: Ivonete Markman, Carmel, IN (US)

(73) Assignee: Thomson Licensing, Issy les Moulineaux (FR)

( * ) Notice: Subject to any disclaimer, the term of this patent is extended or adjusted under 35 U.S.C. 154(b) by 106 days.

(21) Appl. No.: 13/511,682

(22) PCT Filed: Dec. 3, 2009

(86) PCT No.: PCT/US2009/006367
§ 371 (c)(1),
(2), (4) Date: May 24, 2012

(87) PCT Pub. No.: WO2011/068496
PCT Pub. Date: Jun. 9, 2011

(65) Prior Publication Data
US 2012/0275469 A1 Nov. 1, 2012

(51) Int. Cl.
| H04J 3/00 | (2006.01) |
| H04L 1/00 | (2006.01) |
| H04N 21/2383 | (2011.01) |
| H03M 13/29 | (2006.01) |
| H03M 13/00 | (2006.01) |
| H04N 21/63 | (2011.01) |
| H04N 21/438 | (2011.01) |

(52) U.S. Cl.
CPC ......... *H04N 21/4382* (2013.01); *H03M 3/6331* (2013.01); *H04L 1/0071* (2013.01); *H04N 21/2383* (2013.01); *H03M 13/2963* (2013.01); *H03M 13/658* (2013.01); *H03M 13/6538* (2013.01); *H04N 21/631* (2013.01); *H04L 1/005* (2013.01)
USPC ........................... 370/464; 370/203; 375/265

(58) Field of Classification Search
CPC .................... H03M 13/2963; H03M 13/6331; H03M 13/6538
USPC ...................................................... 370/464
See application file for complete search history.

(56) References Cited

U.S. PATENT DOCUMENTS

| 6,799,246 | B1 | 9/2004 | Wise et al. | |
| 7,725,810 | B2 * | 5/2010 | Paumier et al. | 714/800 |
| 7,890,845 | B2 * | 2/2011 | Denk et al. | 714/784 |
| 2002/0116715 | A1 * | 8/2002 | Apostolopoulos | 709/231 |
| 2005/0198686 | A1 | 9/2005 | Krause et al. | |
| 2005/0281289 | A1 | 12/2005 | Huang et al. | |
| 2006/0268012 | A1 | 11/2006 | MacInnis et al. | |
| 2007/0081605 | A1 * | 4/2007 | Choi | 375/265 |
| 2009/0175210 | A1 | 7/2009 | Vijayan et al. | |
| 2010/0254489 | A1 * | 10/2010 | Citta | 375/299 |
| 2011/0113301 | A1 * | 5/2011 | Limberg | 714/755 |

* cited by examiner

Primary Examiner — Hassan Kizou
Assistant Examiner — Deepa Belur
(74) Attorney, Agent, or Firm — Robert D. Shedd; Jerome G. Schaefer

(57) ABSTRACT

An apparatus for processing a first and a second stream of digital data includes a stagger multiplexer and a stagger demultiplexer. Each stream of digital data includes data blocks. The stagger multiplexer processes the first and the second streams of digital data concurrently to output a combined stream of digital data. The stagger demultiplexer processes the combined stream of digital data to output a first and a second stream of extrinsic digital data.

14 Claims, 13 Drawing Sheets

FEC ENCODER

DTV M/H RECEIVER

HIGH LATENCY FEC

LOW LATENCY FEC

| Time, T | 0 | 1 | 2 | 3 | 4 | 5 | 6 | 7 | 8 | 9 | 10 | 11 |
|---|---|---|---|---|---|---|---|---|---|---|---|---|
| Write MAi | MA0 | MA1 | MA2 | MA0 | MA1 | MA2 | | | | | | |
| Data In MAi | A0 | A1 | A2 | A3 | A4 | A5 | | | | | | |
| Wrote MBi | MB0 | MB1 | MB2 | MB0 | MB1 | MB2 | | | | | | |
| Data In MBi | B0 | B1 | B2 | B3 | B4 | B5 | | | | | | |
| Read MAi | | | MA1 | | MA2 | | MA0 | | MA1 | | MA2 | |
| Read MB1 | | MB0 | | MB1 | | MB2 | | MB0 | | MB1 | | MB2 |
| Data Out | A0 | B0 | A1 | B1 | A2 | B2 | A3 | B3 | A4 | B4 | A5 | B5 |

MAi, MBi, i = 0, 1, 2

| Time, T | 0 | 1 | 2 | 3 | 4 | 5 | 6 | 7 | 8 | 9 | 10 | 11 |
|---|---|---|---|---|---|---|---|---|---|---|---|---|
| Data In | A0 | B0 | A1 | B1 | A2 | B2 | A3 | B3 | A4 | B4 | A5 | B5 |
| Write MAi | MA0 | | MA1 | | MA2 | | MA0 | | MA1 | | MA2 | |
| Write MBi | | MB0 | | MB1 | | MB2 | | MB0 | | MB1 | | MB2 |
| Read MAi | | | | | | | MA0 | MA1 | MA2 | MA0 | MA1 | MA2 |
| Data Read MAi | | | | | | | A0 | A1 | A2 | A3 | A4 | A5 |
| Read MBi | | | | | | | MB0 | MB1 | MB2 | MB0 | MB1 | |
| Data Read MBi | | | | | | | B0 | B1 | B2 | B3 | B4 | B5 |

MAi, MBi, i = 0, 1, 2

DATA BLOCK PROCESSOR IN A MOBILE DTV SYSTEM WITH DIVERSITY

This application claims the benefit, under 35 U.S.C. §365 of International Application PCT/US2009/006367, filed Dec. 3, 2009, which was published in accordance with PCT Article 21(2) on Jun. 9, 2011 in English.

FIELD

The present arrangement relates to mobile DTV systems and more specifically to a processor that recovers decodable data blocks in a mobile DTV stream with diversity, implemented using a small memory size and minimal latency.

BACKGROUND

The Advanced Television Systems Committee (ATSC) standard for Digital Television (DTV) in the United States requires an 8-Vestigial Sideband (VSB) transmission system which includes Forward Error Correction (FEC) as a means of improving the system performance. The FEC system consists of a Reed-Solomon encoder, followed by a byte interleaver, and a trellis encoder on the transmitter side. At the receiver end, there is a corresponding trellis decoder, byte deinterleaver and Reed-Solomon decoder. The ATSC-DTV standard is document A53.doc, dated Sep. 16, 1995 produced by the United States Advanced Television Systems Committee. FIG. 1 shows a simplified block diagram of the DTV transmitter and receiver, emphasizing the FEC system.

The ATSC has started a study group to create a new M/H (mobile/handheld) DTV standard that is backwards compatible with the current DTV standard (A/53), more robust, more flexible, and provides expanded services to customers utilizing mobile and handheld devices. The new proposals have added a new layer of FEC coding and more powerful decoding algorithms to decrease the Threshold of Visibility (TOV).

The added layer of FEC coding requires decoding techniques such as turbo decoding discussed in an article by C. Berrou, A. Glavieux and P. Thitimajshima, entitled "Near Shannon Limit Error—Correcting Coding and Decoding: Turbo-Codes," found in Proceedings of the IEEE International Conference on Communications—ICC'93, May 23-26, 1993, Geneva, Switzerland, pp. 1064-1070. A discussion of turbo coding can be found in the article by M. R. Soleymani, Y. Gao and U. Vilaipornsawai, entitled "Turbo Coding for Satellite and Wireless Communications," Kluwer Academic Publishers, USA, 2002.

Decoding of signals encoded for ATSC DTV with an added FEC layer can also involve trellis decoding algorithms like maximum a posteriori (MAP) decoders as described by L. R. Bahl, K. Cocke, F. Jelinek and J. Rariv, in an article entitled "Optimal Decoding of Linear Codes for Minimizing Symbol Error Rate," found in IEEE Transactions on Information Theory, Vol. IT-20, No. 2, March 1974, pp. 284-287. Another discussion of trellis coders and a MAP decoder is found in an article written by A. J. Viterbi, entitled "An Intuitive Justification and a Simplified Implementation of the Map Decoder for Convolutional Codes," found in IEEE Journal on Selected Areas in Communications, Vol. 16, No. 2, February 1998, pp. 260-264.

In addition, the FEC system may allow for transmission with time diversity as described by International Patent Applications WO 2008/144004 and 2009/064468. Although the proposed systems attempt to provide backwards compatibility with the current DTV standard, no other known system permit diversity within their coding structure.

This arrangement proposes a processor that recovers decodable data blocks in a mobile DTV stream with diversity, implemented using a small memory size and minimal latency.

SUMMARY

An apparatus for processing a first and a second stream of digital data includes a stagger multiplexer and a stagger demultiplexer. Each stream of digital data includes data blocks. The stagger multiplexer processes the first and the second streams of digital data concurrently to output a combined stream of digital data. The stagger demultiplexer processes the combined stream of digital data to output a first and a second stream of extrinsic digital data.

The stagger multiplexer includes a first memory that processes the first stream of digital data and a second memory that processes the second stream of digital data. Each memory includes M memory blocks, each memory block including N words, each word including B bits. The first and second streams of digital data are processed concurrently.

The first and second streams of digital data include groups of 2*M data blocks and the combined stream of digital data includes groups of 2*M data blocks.

The first memory writes data blocks received from the first stream of digital data to memory blocks and the second memory writes data blocks received from the second stream of digital data to memory blocks concurrently. Each data block is written at a rate of one data block per time interval T.

Each of the first memory and second memory writes data blocks to their respective memory blocks by continuously rotating through their respective M memory blocks.

The combined stream of digital data is generated by alternately extracting data blocks from the memory blocks of the first memory and the memory blocks of the second memory, starting with the first memory.

Each of the first memory and second memory extracts data blocks from their respective memory blocks by continuously rotating through their respective M memory blocks.

The extracting of a first data block from the first memory is performed after a first word of a first data block is written to the first memory.

The data blocks of the first stream of digital data includes alternating information blocks and zero blocks and the data blocks of the second stream of digital data includes alternating parity blocks and zero blocks.

The stagger demultiplexer includes a first memory and a second memory that processes the combined stream of digital data. Each memory includes M memory blocks, each memory block including N words, each word including B bits. The first and second output streams of digital data are processed concurrently.

The first and second memory alternately writes data blocks received from the combined stream to their respective memory blocks, starting with the first memory. The data blocks are written at a rate of one data block to the first memory and one data block to the second memory per time period T.

Each of the first memory and second memory writes data blocks to their respective memory blocks by continuously rotating through their respective M memory blocks.

The first stream of extrinsic digital data and the second stream of extrinsic digital data are generated concurrently, by extracting data blocks from the memory blocks of the first memory to generate the first stream of extrinsic digital data and extracting data blocks from the memory blocks of the second memory to generate the second stream of extrinsic digital data.

Each of the first memory and second memory extracts data blocks from their respective memory blocks by continuously rotating through their respective M memory blocks.

The extracting of a first data block from the first memory and the extracting of a first data block from the second memory are performed after the respective Mth memory blocks of the first and second memory are written to.

BRIEF DESCRIPTION OF THE DRAWINGS

FIG. 6 depicts an example a Packet Interleaver taking bytes from a fixed number of consecutive packets in a row-by-row order, and outputting the bytes column-by-column;

FIG. 7 depicts an example of a Packet Deinterleaver taking bytes from resulting block code codewords for the original group of packets in a column-by-column order; and outputting the bytes in a row-by-row order

DETAILED DESCRIPTION OF THE EMBODIMENTS

Figure 1:
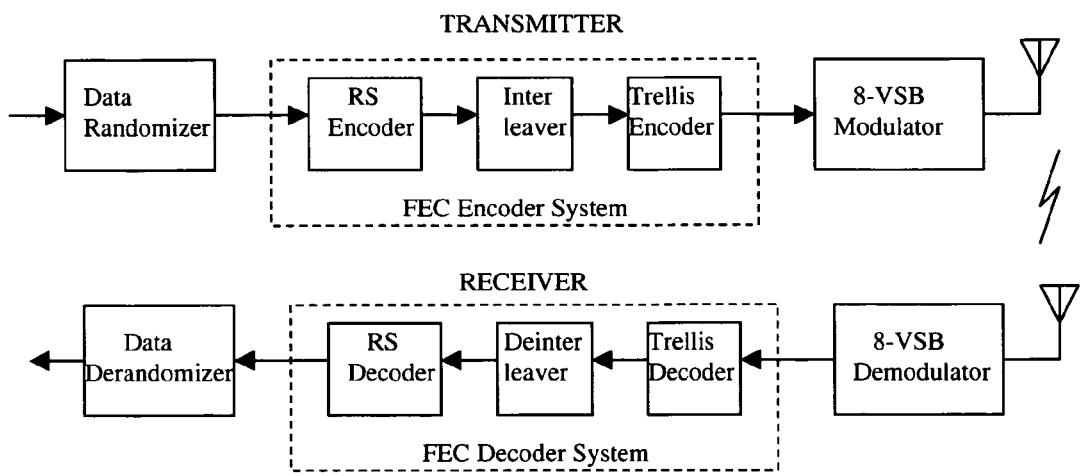
FIG. 1 depicts an example block diagram of a digital television transmitter and receiver system.

FIG. 1 shows an example of a DTV system that incorporates forward error correction. Input digital data, which may be considered any of video, audio, textual, or other information data, is encoded using a DTV standard and transmitted to a receiver which decodes the digital data.

Figure 2:
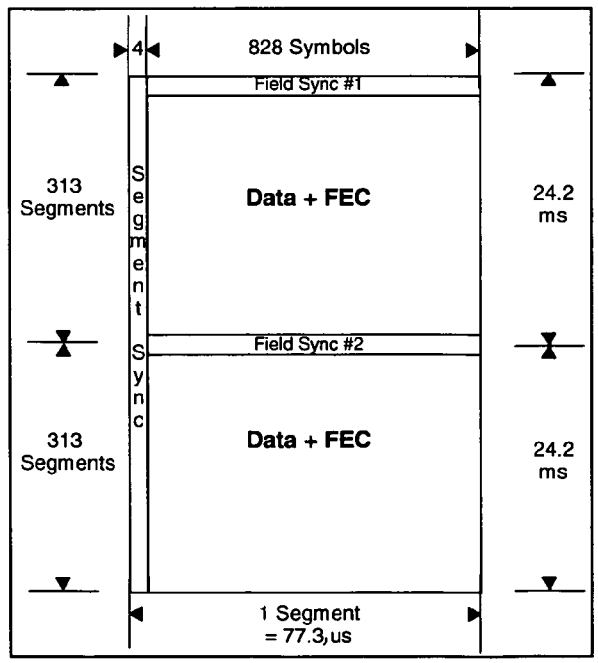
FIG. 2 depicts an example digital television data frame.

FIG. 2 shows an exemplary DTV data frame organized for transmission. Each data frame may include two data fields, each containing 313 data segments. The first data segment of each data field may be a unique synchronizing segment (Data Field Sync). The remaining 312 data segments may each carry the equivalent of one 188-byte MPEG-compatible transport packet and its associated FEC data.

Each data segment may consist of 832 8-VSB symbols. The first four symbols of each data segment, including the Data Field Sync segments, form a binary pattern and provide segment synchronization. The first four 8-VSB symbols of each data segment have values of +5, −5, −5, and +5. This four-symbol data segment sync signal also represents the sync byte of each 188-byte MPEG-compatible transport packet conveyed by each of the 312 data segments in each data field. The remaining 828 symbols of each data segment carry data equivalent to the remaining 187 bytes of a transport packet and its associated FEC data.

Figure 3:
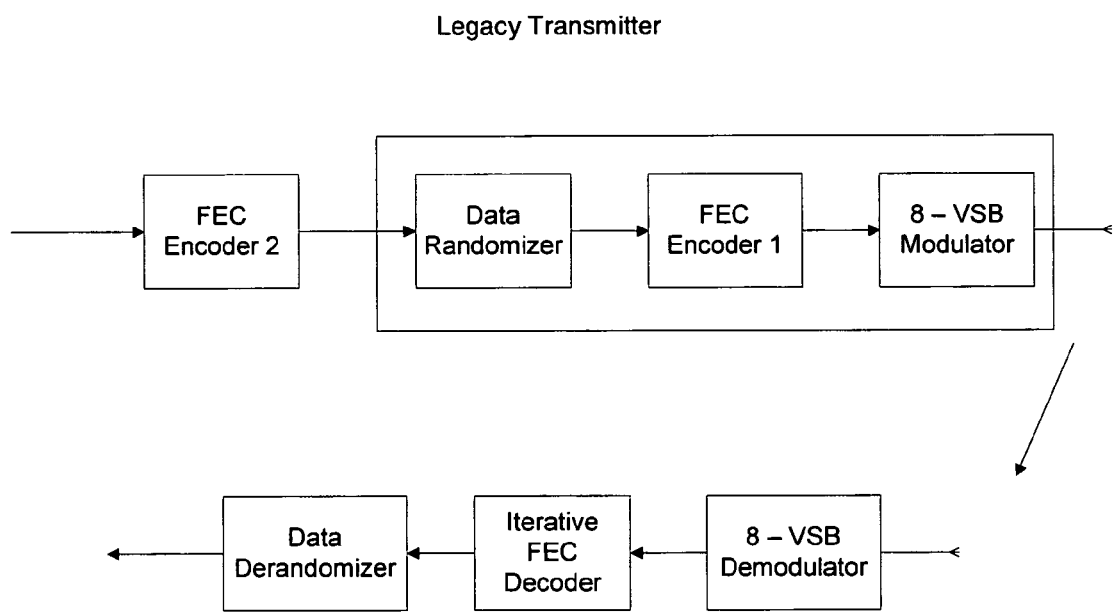
FIG. 3 depicts an example of a DTV M/H system in accordance with the principles of the current arrangement.

FIG. 3 shows a simplified block diagram of an exemplary transmitter and receiver for an M/H DTV system, hereby called DTV-M/H, wherein the added layer of FEC encoding, exemplified by FEC Encoder 2, may includes a packet block code and FEC Encoder 1 is compatible with the ATSC FEC encoder shown in FIG. 1. At the receiver, the Iterative FEC Decoder performs turbo decoding of the various FEC encoders. The Iterative FEC decoder in question may includes MAP decoding of the ATSC trellis decoder and the added FEC codes within FEC Encoder 2 which will iteratively interact, resulting in each decoder sending extrinsic information to the other. In addition, the Iterative FEC Decoder will perform a number of iterations M deemed necessary to achieve a desired system performance.

Figure 4:
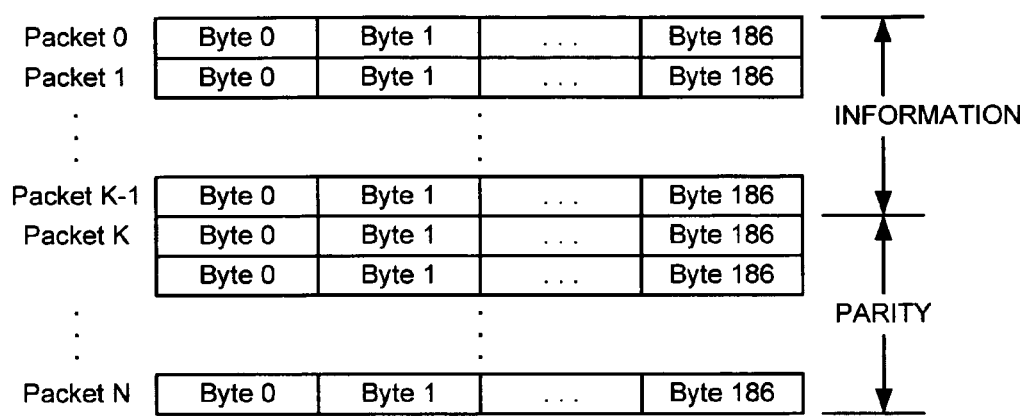
FIG. 4 depicts an example packet structure of a packet block code of code rate R=K/N in accordance with the principles of the current arrangement.

FIG. 4 shows a packet structure of a Packet Block Code having a rate R=K/N in accordance with the principles of the current arrangement. The block code is such that for each K packets of data, having 187 information bytes (assuming MPEG packets without the sync byte, 0x47 or 47 Hex, as in the ATSC standard), the block code adds N−K parity packets. This block code may be a Serial Concatenated Block Code (SCBC) over a Galois Field GF(256) similar to that described in International Patent Application WO 2008/144004 mentioned above, wherein each column in FIG. 3 would be a separate code word of N bytes associated with the first K information bytes.

Figure 5:
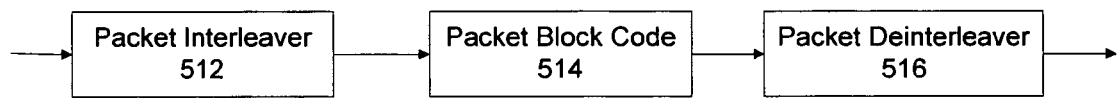
FIG. 5 depicts an example of a second FEC encoder.

FIG. 5 shows an FEC Encoder according to the present arrangement. FEC block encoder 514 may be preceded by a packet interleaver 512 and followed by a packet deinterleaver 516. The operation of packet interleaver 512 and packet deinterleaver 516 are set forth more specifically hereinafter with reference to FIGS. 6 and 7, respectively.

Figures 6A, 6B:
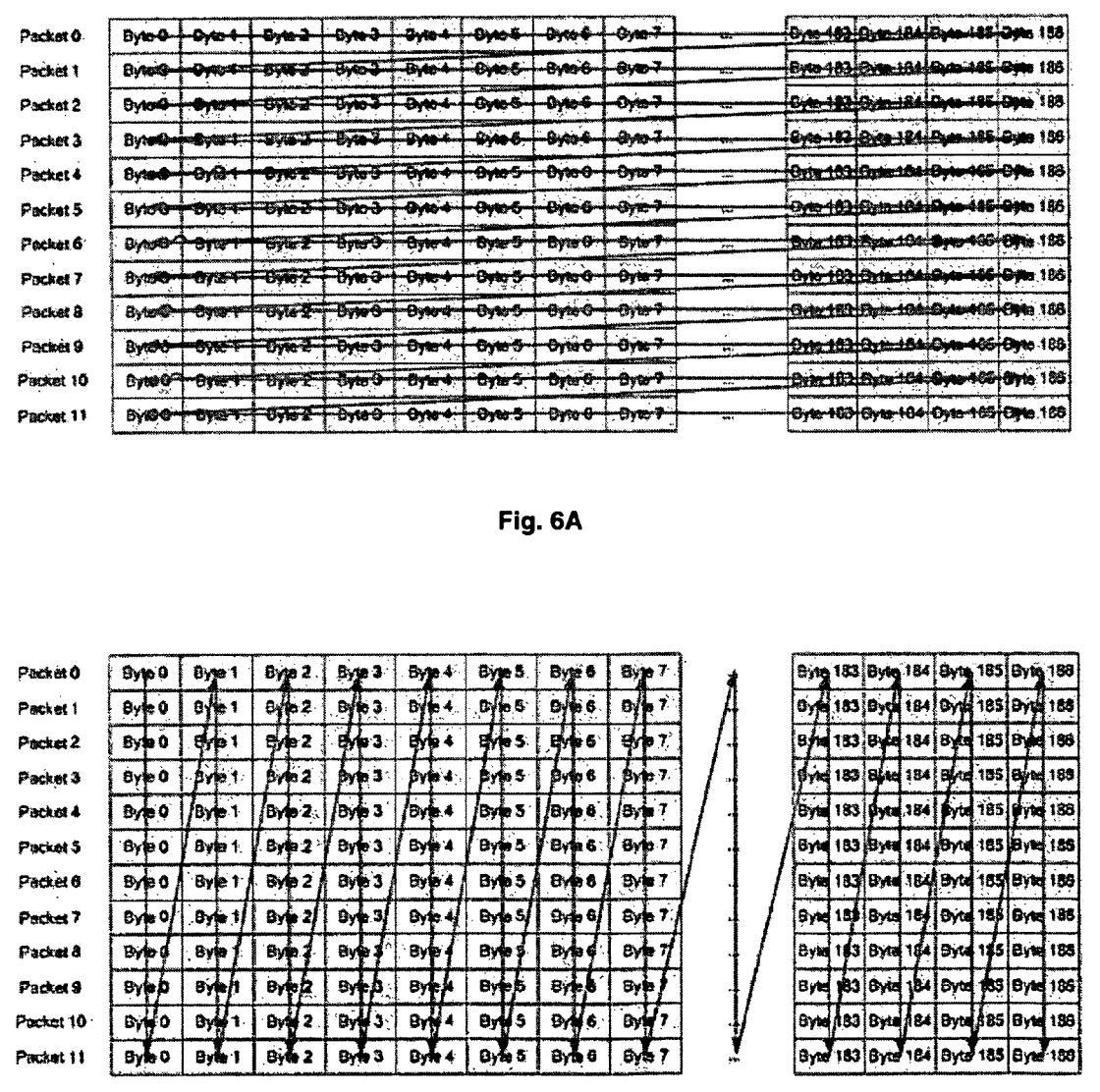

The Packet Interleaver 512 may take bytes from a fixed number of consecutive packets in a row-by-row order as shown in FIG. 6A, and outputs the bytes column-by-column, as shown in FIG. 6B, for the case of R=12/26. In this manner, all first bytes of the packets will be grouped together, all second bytes of the packets will be grouped together, and so on to the last bytes of the packets. Each source packet is an MPEG transport stream packet with the 0x47 sync byte removed, as in the A/53 ATSC DTV standard. As a result each packet has a length of 187 bytes. The number of packets in each code frame is the same as the number of source symbols required for the GF(256) Serial Concatenated Block Code. The Packet Interleaver is known in the art as a (K, 187) matrix interleaver.

Figures 7A, 7B:
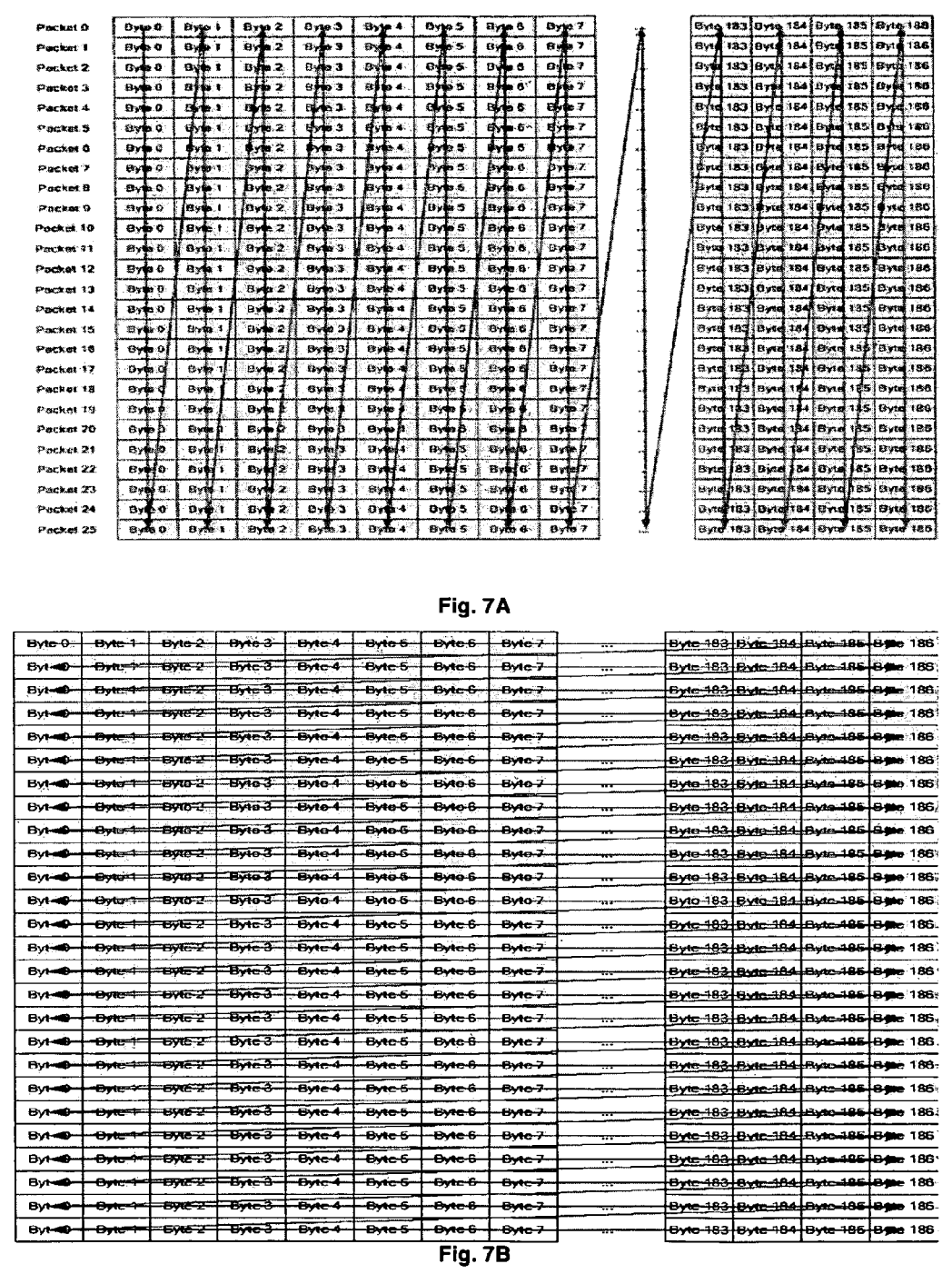

The Packet Deinterleaver 516 may take bytes from the resulting SCBC codewords for the original group of packets in a column-by-column order as shown in FIG. 7A. The bytes are then output row-by-row, as shown in FIG. 7B, for the case of R=12/26. In this manner, the original packets are reconstituted and new packets are created from the parity bytes of the SCBC codewords. Each packet corresponds to a common GF(256) symbol location in all created SCBC codewords. The Packet Deinterleaver is specified as a (N, 187) matrix deinterleaver An example of a burst repetitive data structure for transmission of the DTV_M/H data is given in Table 1. The DTV M/H receiver discards the Legacy ATSC data segments or packets, and works on the remaining data, which includes training data, also called a priori tracking (APT) packets, in addition to the synchronization data present in the ATSC-DTV data frame described above. This preamble training data, however, is fully encoded by all levels of legacy ATSC FEC coding in the system (FEC encoder 1), as well as being interleaved and randomized. An example of a burst repetitive data structure for transmission of the DTV-M/H data is given in Table 1.

TABLE 1

DTV-M/H Data Structure

| | |
|---|---|
| Data Field F0 | ATSC Field Sync |
| | 156 DTV-M/H Data and Preamble Segments |
| | 156 Legacy ATSC Data Segments |
| Data Field F1 | ATSC Field Sync |
| | 312 Legacy ATSC Data Segments |
| Data Field F2 | ATSC Field Sync |
| | 312 Legacy ATSC Data Segments |

As shown in Table 1, a data burst comprising three data fields, F0, F1 and F2, is repetitively transmitted, each corresponding to 1.5 frame of the legacy ATSC-DTV standard.

When receiving a data burst such as set forth in Table 1, a DTV-M/H receiver will discard the 156 Legacy ATSC data segments in Data Field F0 and process the remaining data including the preamble training data segments. The preamble training data is to be utilized by the DTV-M/H receiver in order to enhance performance.

Figure 8:
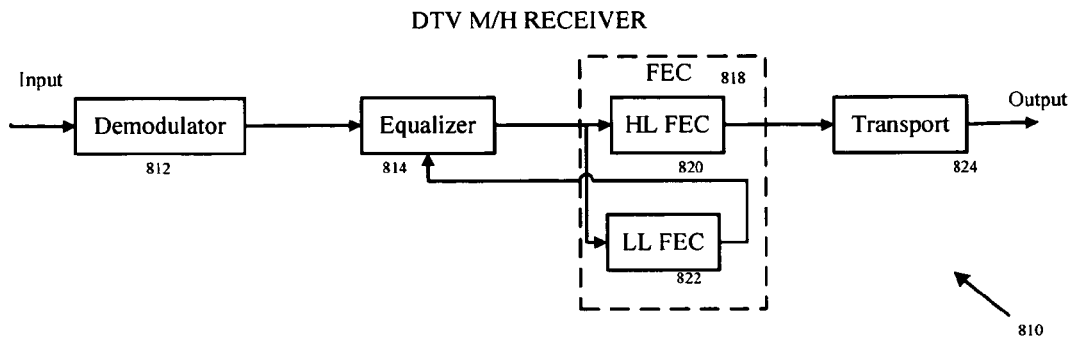
FIG. 8 depicts an example of a receiver implementation for a mobile DTV system according to the present arrangement.

FIG. 8 shows a general block diagram of a receiver implementation for a mobile DTV receiver 810 used in the present arrangement. The receiver 810 is generally composed of a demodulator 812, equalizer 814, FEC decoding block 818 and transport function block 824, which includes video decoding. One skilled in the art will be familiar with the general functionality of these blocks in a DTV receiver. In this particular mobile system, the FEC decoder has two levels: High Latency (HL) 820, which has N iterations or cores and feeds the transport block, and Low Latency (LL) 822 with M<N iterations or cores, which feeds the equalizer to increase its performance.

Figure 9:
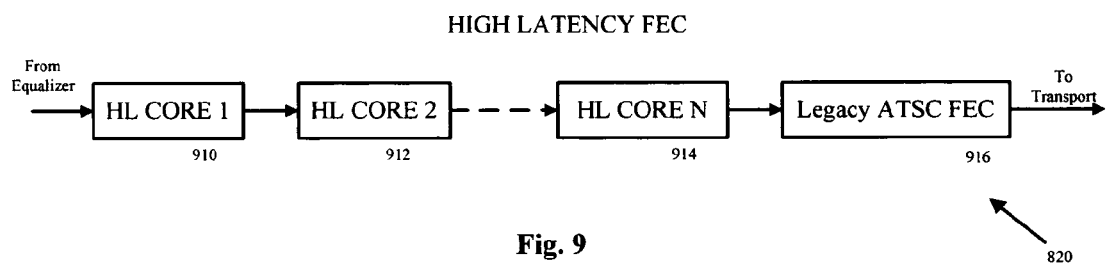
FIG. 9 depicts an example of the High Latency FEC (HL FEC) according to the present arrangement.

FIG. 9 shows a more detailed diagram of HL FEC 820. Forward error correction in a system provides for error control for data transmissions. This is performed by sending redundant data to its messages, known as error correction codes that allow the receiver to detect and correct errors without the need to ask the sender for additional data or resending of data. HL FEC 820 has a plurality of HL Cores represented by HL Core 1 910, HL Core 2 912, and HL Core N 914, and as a last block, a legacy ATSC FEC block 916. Legacy ATSC FEC Block 916 includes a combination of the legacy FEC functions associated with the legacy ATSC decoder in FIG. 1, including particularly, an RS decoder, derandomizer and data interface to the transport block.

Figure 10:
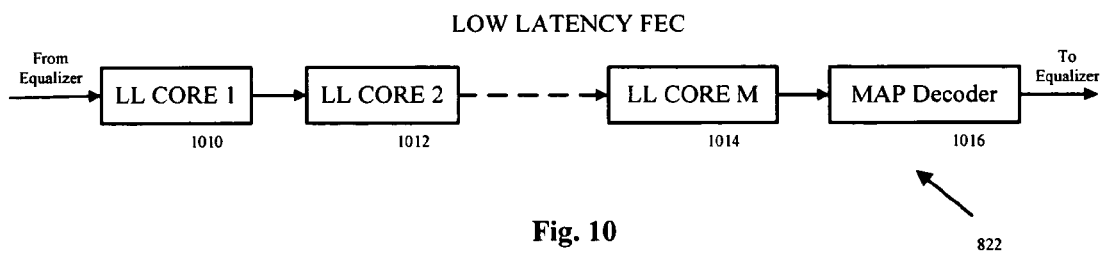
FIG. 10 depicts an example of the Low Latency FEC (LL FEC) according to the present arrangement.

FIG. 10 shows a more detailed diagram of LL FEC 822. LL FEC 822 has as a last block, a trellis or MAP decoder 1016, since it is feeding 8-VSB symbols to the equalizer. LL FEC 722 also has a plurality of LL Cores represented by LL Core 1 1010, LL Core 2 1012, and LL Core M 1014. The main difference between the HL and LL cores is the latency of the core blocks. Since the LL FEC 822 feeds the equalizer 814 of FIG. 8, its functionality must be designed for minimum latency, and therefore, it is not as robust as the HL FEC 820 in performance.

Figure 11:
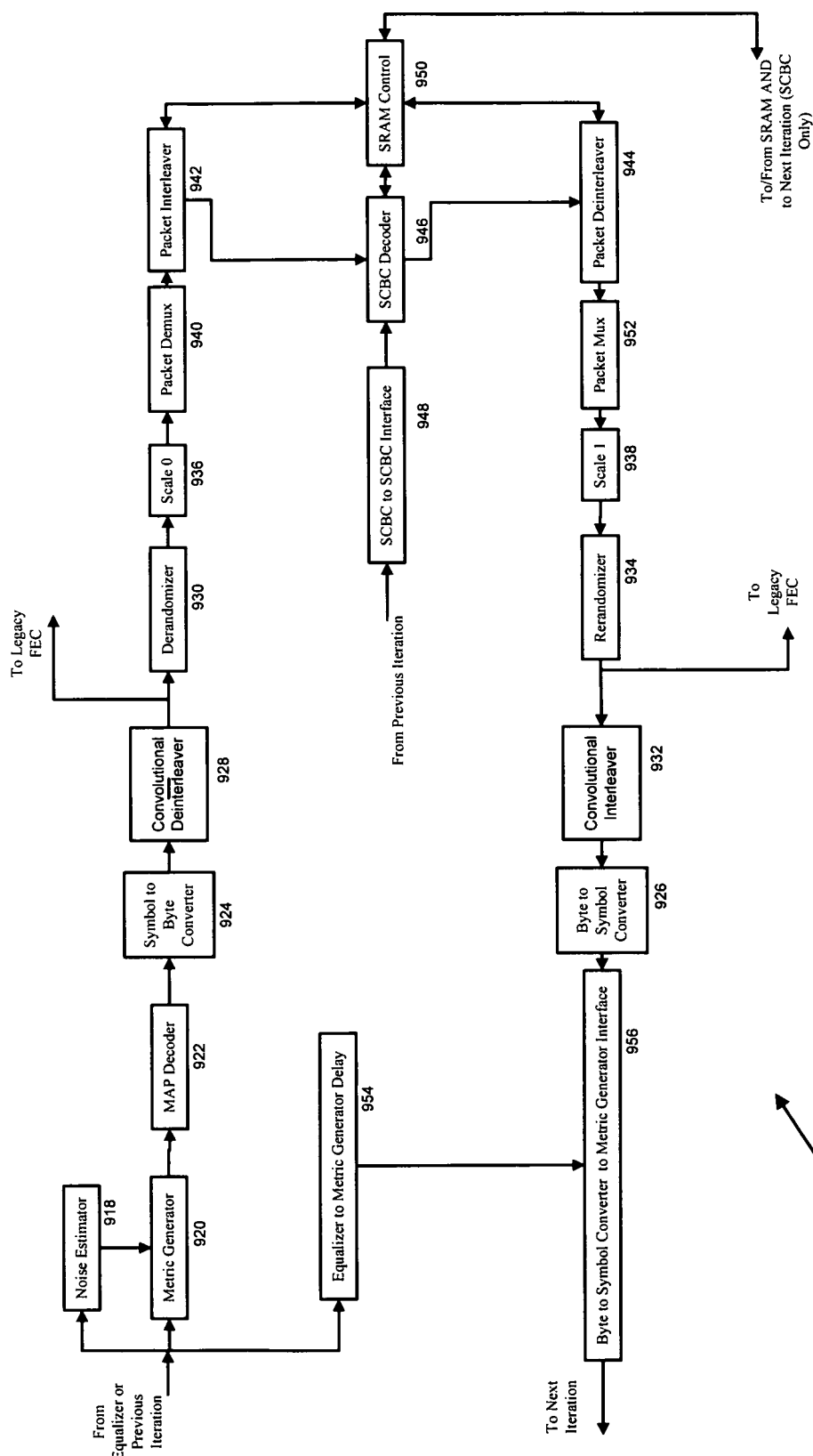
FIG. 11 depicts a block diagram of an HL FEC core according to the present arrangement.

FIG. 11 shows a block diagram of an HL FEC core 910. The input to each core consists of two streams: the first stream is the originally received stream (after demodulation and equalization), which is delayed and unaltered within each core to match the processing delay of the core and sent to the following core; and the second stream is a stream of extrinsic information associated with the received stream, as processed by the previous core. A noise estimator 918, metric generator 920 and MAP decoder 922 may be included in the HL FEC core, all of which are known in the art. Noise estimator 918 estimates the noise power in a received input stream to an HL FEC core. Metric generator 920 compares the symbols in the received input stream against the optimal 8-VSB values and calculates and stores the metrics needed by the MAP decoder, for the specific noise power. In addition, metric generator 920 calculates, stores and passes to the MAP decoder extrinsic information from the previous FEC core, also called a priori metrics. MAP decoder 922 decodes the ATSC trellis code with the metrics and the a priori metrics received from metric generator 920 and produces dual-bits.

Symbol to byte converter (S2B) 924 groups dual-bit outputs of MAP decoder 922 associated with each 8-VSB symbol in bytes (4 dual-bits per byte). The output of the MAP decoder is a soft decision version of a dual-bit, instead of 2 bits. For example, each dual-bit could be represented by 20 bits and a soft byte would then be represented by 80 bits. S2B 924 also converts the stream from symbol based to byte based.

Convolutional deinterleaver 928 is connected between S2B 924 and derandomizer 930. The convolutional deinterleaver 928 and derandomizer 930 have the same functionality as in the legacy ATSC standard as well as having the additional ability to handle soft bytes of more than 8 bits. Convolutional deinterleaver 928 rearranges the received data from a previously interleaved sequence. Derandomizer 930 derandomizes the received data to prepare the data for processing by scale 0 936.

Scale 0 936 scales the soft bytes of the data stream received from derandomizer 930 by a chosen factor. This factor is microprocessor controlled. The scaling factor can be between 0.5 and 1.0, varying for each core. Properly chosen values optimize performance of the HL FEC.

Packet demultiplexer 940 discards legacy ATSC data and only passes mobile data to the remaining blocks.

Packet interleaver 942 receives the signals from packet demultiplexer 940 and performs block interleaving operations associated with the GF(256) SCBC block code.

SCBC decoder 946 receives data from packet interleaver 942 and performs the block decoding operation for the GF (256) SCBC blocks, as discussed previously. SCBC decoder 946 handles soft bytes, and is also a soft decision block decoder.

SCBC-to-SCBC interface 948 connects two SCBC decoders from two adjacent cores in order to pass extrinsic information and control signals from one FEC core to the next.

SRAM control 950 interfaces the packet interleaver 942, packet deinterleaver 944 and SCBC decoder 946 to an SRAM needed to perform their respective functionalities.

Packet deinterleaver 944 receives data from SCBC decoder 946 and performs the block deinterleaving operations associated with the GF(256) SCBC block code.

Packet multiplexer 952 receives data from packet deinterleaver 944 and recreates a full stream with both legacy and mobile data by obtaining the mobile data from the extrinsic information received from the SCBC decoder block 946 (through the packet deinterleaver 944) and zeroing the legacy data, since it is not of interest to the mobile DTV decoder. The SCBC extrinsic information is used to enhance the performance of the MAP decoder of the subsequent core or iteration.

Scale 1 938 scales the soft bytes of the data stream received from packet multiplexer 952 by a chosen factor. This factor is microprocessor controlled. The scaling factor can be between 0.5 and 1.0, varying for each core. Properly chosen values optimize performance of the HL FEC.

Rerandomizer 934 is connected between scale 1 938 and convolutional interleaver 932. The rerandomizer 934 has the same functionality as in the legacy ATSC standard as well as the additional ability to handle soft bytes of more than 8 bits. Rerandomizer 934 randomizes the received data. Convolutional interleaver 932 rearranges the received data into a sequence that is less prone to long sequences of errors.

Byte-to-symbol converter (B2S) block 926 performs the inverse functionality of the S2B block 924. It separates a soft byte into soft dual-bits and converts the data from byte based to symbol based.

B2S to metric generator interface 956 obtains extrinsic information from B2S 926 and the delayed received input signals (data and sync) from the core input, and synchronizes these two sets of data with minimum latency and loss of data, outputting the two sets of data to the next core.

Equalizer to metric generator delay 954 delays the originally received data stream, field and segment sync, as well as other synchronization signals to match the overall latency of the current core blocks. In addition it passes a symbol enable from the input to the output of the core without delay.

The LL FEC core is a subset of the HL FEC core, where some of the blocks of the HL FEC core are replaced by a simpler functionality in order to decrease latency. As a result some portions of data are lost but the remaining extrinsic information must still be synchronized with the core input data and fed to the next core. The main differences between an LL FEC core and an HL FEC core are stated in the paragraph below.

The Metric generator and MAP decoder of the LL FEC core have a reduced latency, and therefore, lesser performance than in the HL FEC core. The convolutional deinterleaver, derandomizer, convolutional interleaver, (re)randomizer, packet demultiplexer, packet interleaver, packet deinterleaver, and packet multiplexer are not present in the LL FEC core and instead are replaced by different, simplified components that perform the operations of (de)randomizing and (re)randomizing as well as extracting the mobile data of interest, which is a subset of the entire mobile data. The SCBC decoder of the LL FEC core has a different code rate than the HL FEC code rate for the purpose of decreasing the latency of the core. In addition, the Equalizer to metric generator delay block of the LL FEC core has a smaller latency than in the HL FEC core.

Figure 12:
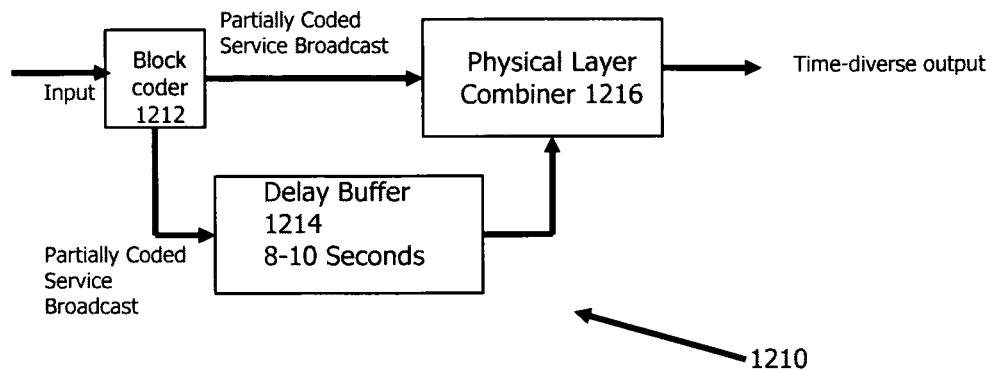
FIG. 12 depicts a mobile DTV system supporting time diversity according to the present arrangement.

FIG. 12 shows a mobile DTV system with time diversity 1210. As discussed, the mobile DTV system may be flexible enough for transmission with time diversity. The main flexibility comes from the structure of the GF (256) block code and separation of blocks of segments (or packets) of data into information and parity packets at block coder 1212 which can produce a partially coded service broadcast. An information block contains all information packets and possibly some parity packets. A parity block only contains parity packets. In addition, a parity block can be used to derive information packets. Specifically, a parity block contains a linear combination of all the information packets. These information or parity blocks can then be delayed with respect to each other. The delays can be within a range of 8 to 10 seconds before transmission by delay buffer 1214, as shown in FIG. 12, and regrouped in the receiver or physical layer combiner 1216 to obtain a robust system performance. The output of combiner 1216 is a robust time-diverse output. The information and parity blocks in the combiner 1216 output from the delayed and non-delayed paths can each be independently decoded for deep fades. Together, they provide maximum threshold performance.

The present arrangement uses a time diversity scheme associated with the data and parity blocks of packets of the GF (256) SCBC encoder. As an example, a code rate of R=12/52 is used, according to FIG. 4. Each codeword of 52 packets is split into two blocks of 26 packets: A and B blocks. The A block contains the 12 information packets (and 12 parity packets) and is hereby called an information block. The B block contains only parity packets and is hereby called a parity block. As a result, information (A) and parity (B) blocks in FIG. 4 are 26 packets each and serially transmitted, where A and B jointly compose a 52 packet block out of the SCBC encoder or the packet deinterleaver. The code rate R is exemplary and may be defined as a different value, which would also result in different sized A and B blocks.

The original stream without diversity at the input to the legacy ATSC transmitter can be represented as Data Stream (1):

$$|A(0)|B(0)|A(1)|B(1)| \ldots |A(L)|B(L)|A(L+1)|B(L+1) \tag{1}$$

This is represented in FIG. 12 as the input to block coder 1212.

In order to add time diversity capability to the stream, the A and B blocks are first grouped in accordance with the size of a mobile field F0 in Table 1. For a mobile data structure with 156 packets per mobile field F0, this grouping is represented by 6 A or B blocks per field, creating Data Stream (2):

$$|A(0)|A(1)|A(2)|A(3)|A(4)|A(5)|B(0)|B(1)|B(2)|B(3)|B(4)|B(5)|A(6)|A(7)|A(8)|A(9)|A(10)|A(11)|B(6)|B(7)|B(8)|B(9)|B(10)|B(11)| \tag{2}$$

or equivalently Data Stream (3):

$$|AA(0)|BB(0)|AA(1)|BB(1)| \ldots |AA(L)|BB(L)|AA(L+1)|BB(L+1) \tag{3}$$

where AA is a block of 6 As and BB is a block of 6 Bs. The BB blocks are delayed with respect to the AA blocks by feeding the BB blocks through delay buffer 1214 of FIG. 12, in order to create the following separate streams entering physical layer combiner 1216, represented by Data Streams (4):

$$|AA(0)|AA(1)|AA(2)|AA(3)| \ldots |AA(L)|AA(L+1)|AA(L+2)|AA(L+3)| \ldots \rightarrow \text{Delay Buffer} \rightarrow |BB(-L)|BB(-L+1)|BB(-L+2)|BB(-L+3)| \ldots |BB(0)|BB(1)|BB(2)|BB(3)| \tag{4}$$

where, in this case, the delay buffer has a delay of L×26 packets.

The AA and BB delayed streams are then combined at physical layer combiner 1216 by alternately taking a block from each stream to create the time diversity stream, which feeds the legacy ATSC transmitter, represented by Data Stream (5):

$$|AA(0)|BB(-L)|AA(1)|BB(-L+1)| \ldots |AA(L)|BB(0)|AA(L+1)|BB(1)| \tag{5}$$

The legacy ATSC transmitter has the ability to transfer the time diversity stream of Data Stream (5) to a receiver.

Figure 13:
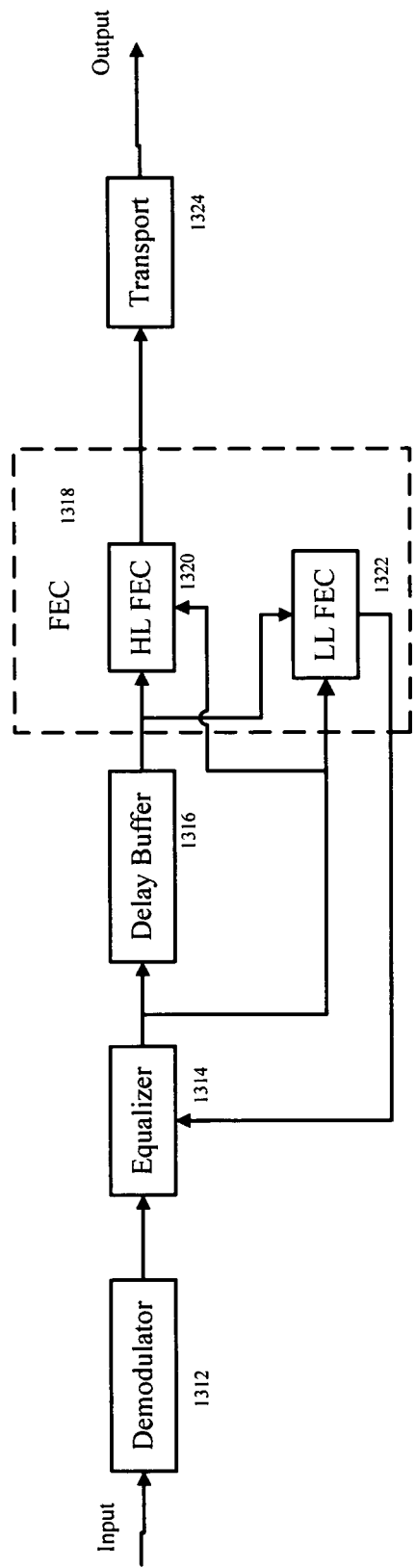
FIG. 13 depicts an example of a receiver implementation for a mobile DTV system with time diversity according to the present arrangement.

FIG. 13 shows a receiver implementation for the present arrangement. At the receiver, after demodulation at demodulator 1312 and equalization at equalizer 1314, delay buffer 1316 creates two versions of the transmitted stream, the first of which represents a delayed version of Data Stream (5), and the second which represents the original stream, Data Stream (5). These two versions are represented by Data Streams (6):

$$\rightarrow \text{Delay Buffer} \rightarrow |AA(0)|BB(-L)|AA(1)|BB(-L+1)| \ldots |AA(L)|BB(0)|AA(L+1)| \ldots |AA(0)|BB(-L)|AA(1)|BB(-L+1)| \ldots |BB(0)|AA(L+1)|BB(1)| |AA(L+2)| \ldots |BB(L)|AA(2L+1)|BB(L+1)| \quad (6)$$

where Delay Buffer 1316 has a length of (2×L)×26 packets. These two streams are then fed into the FEC decoding block 1318. The paragraphs below describe operation of the HL FEC core for the present arrangement, which exists as part of HL FEC 1320. Similar concepts apply to LL FEC 1322 since it can be seen as a subset of the HL FEC 1320.

Figure 14:
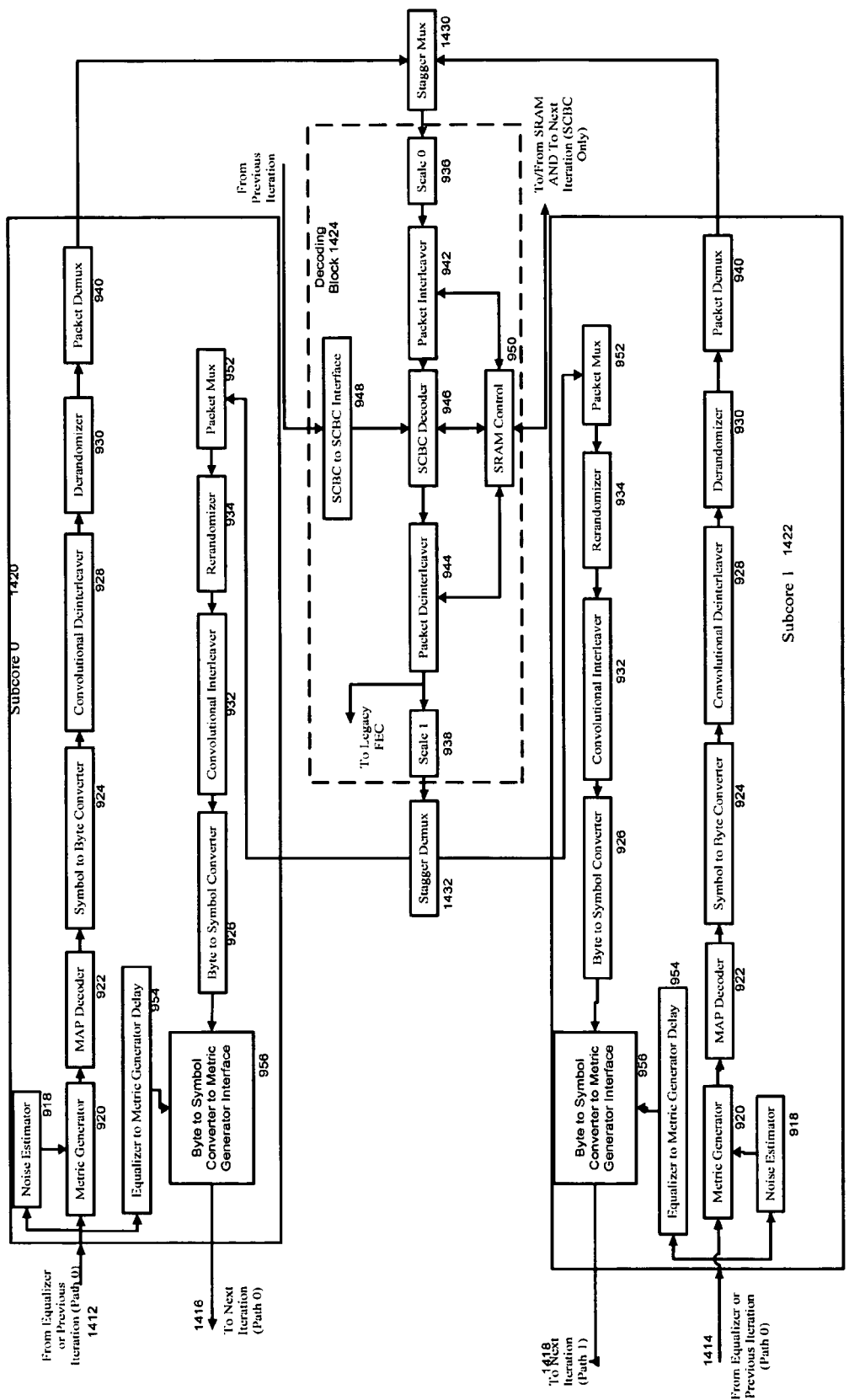
FIG. 14 depicts an HL FEC core supporting time diversity according to the present arrangement.

FIG. 14 shows the architecture for an HL FEC core that receives Data Streams (6) from Delay Buffer 1316 of FIG. 13. Two separate FEC encoded inputs, (Path 0) 1412 and (Path 1) 1414, represented by the two streams of Data Streams (6), enter the dual-stream decoder. The data stream identified as Path 0 passing through the Delay Buffer is received in Subcore 0 while Path 1 identified by the other data stream of Data Streams (6) is received by Subcore 1. In addition, two separate a priori output streams (Path 0) 1416 and (Path 1) 1418 are delivered from one FEC core to the next, as part of the iterative FEC decoding process.

Similar elements from FIG. 11 are also present in the FEC Core of FIG. 14 and only the blocks associated with the GF (256) SCBC code will see the recombined stream. All similar blocks are identified by the same reference numbers found in FIG. 11. The similar blocks in FIGS. 11 and 14 are associated with most legacy ATSC FEC decoder functionalities, including trellis decoding, convolutional deinterleaving and derandomizing, as well as the reencoding counterparts. FIG. 14 also includes decoding block 1424 which contains similar blocks to those discussed with respect to FIG. 11.

The operation of stagger multiplexer 1430 and stagger demultiplexer 1432 is set forth below.

The streams of Data Streams (6) are fed into inputs 1412 and 1414. The streams are then processed by subcore 0 1420 and subcore 1 1422, respectively, before reaching stagger multiplexer 1430. Stagger multiplexer 1430 receives Data Streams (6), and creates one stream of alternating AA blocks and zeros and another stream of alternating BB blocks and zeros, represented by Data Streams (7):

$$|AA(0)|0|AA(1)|0| \ldots |AA(L)|0|AA(L+1)|0| \ldots |BB(0)| |0|BB(1)|0| \ldots |BB(L)|0|BB(L+1)|0| \quad (7)$$

This step is performed by extracting AA and BB blocks from the streams of Data Streams (6) and zeroing the bolded blocks in Data Streams (6), which together do not form meaningful A&B SCBC codewords. For example, AA(0)&BB(0) form a meaningful block of SCBC codewords, but AA(L)&BB(-L) or BB(-L)&AA(L+1) do not. In addition, stagger multiplexer 1430 may also deconstruct the grouping of 6 As and 6 Bs from Data Streams (7) and Data Streams (2), in order to regenerate the stream represented by Data Stream (8):

$$|A(0)|B(0)|A(1)|B(1)| \ldots |A(5)|B(5)|0| \ldots |A(L)|B(L)| |A(L+1)|B(L+1)| \quad (8)$$

The recreated stream is the same as the original stream represented by Data Stream (1), including embedded zeroes, ready to be delivered to decoding block 1424. Since zero is an SCBC codeword, it will pass unchanged through the remaining blocks in the chain.

Following decoding block 1424, stagger demultiplexer block 1432 receives the stream of Data Stream (8), and separates the A and B blocks of Data Stream (8). The blocks are regrouped to be representative of Data Stream (2) and used to generate data streams identical to Data Streams (7) in order to deliver the streams back to subcore 0 1420 and subcore 1 1422.

The grouping of A and B blocks dictates that the passing of extrinsic information from one FEC core to the next occurs as a continuous stream without interruption at the MAP decoder which results in a 0.8 dB gain in AWGN (Additive White Gaussian Noise) performance over an implementation where A and B blocks are not grouped. There is minimal loss in performance for the MAP decoder during that field of data. The loss in performance is only associated with the presence of legacy ATSC interspersed with the mobile ATSC data during the beginning and the end of the mobile data in field F0 of Table 1.

One skilled in the art may observe that increasing the grouping of As and Bs beyond 6 for this particular example does not increase the performance, but instead increases the latency of the receiver. This is because the mobile field F0 only contains 6 blocks of 26 packets. Thus, the size of the grouping of blocks is a function of the size of the mobile field.

The time diversity scheme described above may be extended to include frequency diversity if, for example, the A blocks are transmitted in one frequency and the B blocks in another frequency. At the receiver, those two frequencies would be demodulated and the streams regrouped into Data Stream (5) prior to FEC decoding.

This arrangement proposes an architecture for the two data block processors, stagger multiplexer 1430 and stagger demultiplexer 1432, designed to use minimal memory space and result in minimal latency. This design is part of an iterative system, and when implemented in multiples, will facilitate more efficient receiver designs.

Figures 15A, 15B:
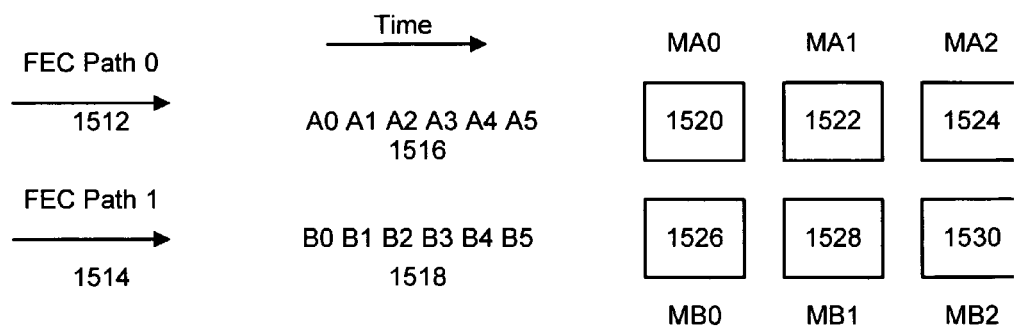
FIG. 15 depicts the block and timing diagrams detailing operation of the stagger multiplexer according to the present arrangement.

FIGS. 15A and 15B depict the block and timing diagrams explaining detailed operation of stagger multiplexer 1430. Stagger multiplexer 1430 is composed of 6 memory sub-blocks MA0, MA1, MA2, MB0, MB1 and MB2, all shown in FIG. 13A and represented by reference numbers 1520, 1522, 1524, 1526, 1528, and 1530, respectively. For this particular embodiment, each memory sub-block has a size of 26 packets, with each packet composed of 207 soft bytes, and each soft byte containing B bits, for example, B=80. Starting at the beginning of a field, the FEC inputs, FEC path 0 1512 and FEC path 1 1514, shown in FIG. 15A, which correspond to the data streams represented by Data Streams (7), respectively, each send an AA or BB group to the corresponding MA or MB memory blocks, where each AA or BB group is composed of 6 A and B sub-blocks, respectively and represented in FIG. 15A by reference numbers 1516 and 1518. The time period associated with each A or B block corresponds to the time of sending 26 packets, or 26×207 soft bytes. As described and shown in Table 1 above, the burst data structure is such that only 156 mobile data packets are transmitted per F0 field, with the subsequent 156 packets being composed of legacy ATSC data which is not processed by stagger multiplexer 1530. Therefore, for every 6 time periods T of M/H data, there are at least 6 other time periods T of processing time for the M/H input data, since those time periods correspond to Legacy ATSC data, which is ignored by the M/H receiver.

One functionality of the stagger multiplexer is to zero the bolded data blocks of Data Streams (6) in order to facilitate the generation of Data Streams (7). This operation is performed with support from a detector that is external to the stagger multiplexer, which identifies the data blocks of interest, which are the non-bolded blocks of Data Streams (6), which are decodable by the SCBC decoder. The bolded blocks are then zeroed, in order to simplify the SCBC decoding operation so that the stagger multiplexer does not need to distinguish between the non-bolded data and the zeros. In addition the SCBC decoder is fed a stream of SCBC codewords, since not only AA&BB blocks contain codewords. All zero portions of the stream will also contain an all zero codeword.

The AA and BB data blocks are written into the memory sub-blocks in the order shown in the timing diagram for Data In, MAi, Write MAi, Data In MBi and Write MBi shown in FIG. 13B. For example, A0 is written into MA0, A1 into MA1, A2 into MA2, A3 into MA0, A4 into MA1 and A5 into MA2. By reusing memory sub-blocks, substantial savings are made in storage space used as well as time due to the large size of the blocks of data. The same writing operations happen for the MB and B sub-blocks concomitantly, hence there are always two write operations into the stagger multiplexer memory at once, but never to the same sub-block since the write operations will always be to both one MA and one MB sub-block.

The reading operation from the stagger multiplexer memory blocks only happens once per soft byte period, as opposed to the two write operations described above. This results in a decrease in latency of the block and also a decrease in overall memory size required for efficient operation. When the first sub-block of data is read, the result is the passing of the data in MA, or A0, directly to the output. Specifically, the write into MA0 happens before a read operation from MA0. The retrieval from subsequent sub-blocks follows the order of Data Stream (8). The read operations switch between an MA and an MB block in sequence, until MB2 block is reached. In that particular block, while data block B2 is being retrieved, data block B5 is being written concurrently. Thus, a read operation must happen before a write operation is performed, for the entire duration of the sub-block. For all remaining sub-blocks, there is no contention between reads and writes.

Since each sub-block has the same size and is written to and read sequentially within the overall memory block, one soft byte at a time, the memory address of each MA or MB memory sub-block serves as a repetitive counter, which counts from 0 to the size-1 of the sub-block, equal to 26×207−1, continuously.

The stagger multiplexer serializes all data received from two separate streams, into one stream of data, and therefore, taking twice the time to transmit it. However, the overall size and latency of the stagger multiplexer processor are the minimum necessary in order to generate Data Stream (8) from Data Streams (7).

Figures 16, 16A:
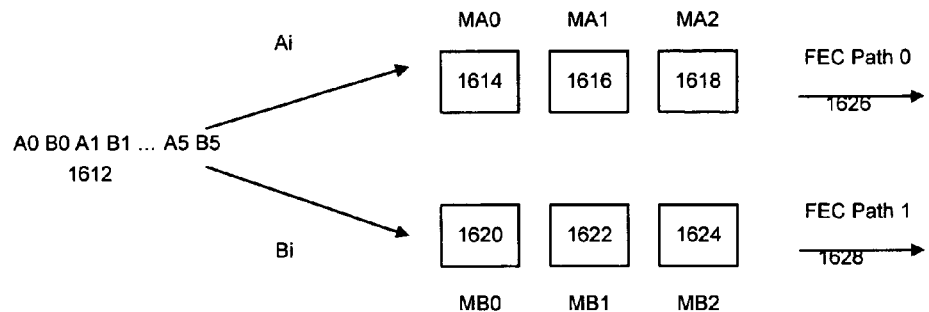
FIG. 16 depicts the block and timing diagrams detailing operation of the stagger demultiplexer according to the present arrangement.

FIGS. 16A and 16B depict the block and timing diagrams detailing the operation of stagger demultiplexer 1432. Stagger demultiplexer 1432 performs the inverse function of stagger multiplexer 1430. It is similarly composed of 6 memory sub-blocks MA0, MA1, MA2, MB0, MB1, and MB2, represented by reference numbers 1614, 1616, 1618, 1620, 1622, and 1624, respectively, shown in FIG. 16A. Each memory sub-block has a size of 26 packets, with each packet having 207 soft bytes, and each soft byte having B bits, for example, B=80. Starting at the beginning of a field is the sequence of A and B sub-blocks according to Data Stream (8), represented by reference number 1612, shown in FIG. 16A. The input is alternatively sent to MA or MB memory blocks, for each time period, T, corresponding to the time of sending 26 packets, or 26×207 soft bytes. The stagger demultiplexer 1432 separates Data Stream (8) into two streams, and hence needs only half the amount of time to transmit its output, compared to its input. The 6 A and 6 B sub-blocks together constitute the 312 packets contained in a field, as described above with regards to the stagger multiplexer. Thus, the data output from the stagger demultiplexer starts at T=6, so that the data is available by the end of the field, resulting in minimal amounts of latency.

The A and B data sub-blocks are written into the memory sub-blocks in the order shown in the timing diagram, for Data In, Write MAi and Write MBi, shown in FIG. 16B. For example, A0 is written into MA0, A1 into MA1, A2 into MA2, A3 into MA0, A4 into MA1, and A5 into MA2. By reusing these memory sub-blocks, substantial savings in storage space are made because the data blocks carry large amounts of data. The same writing operations occur for the A and B sub-blocks, but in alternate T periods. Thus, there is only one write operation into the stagger demultiplexer memory at any particular time.

The reading operations from the stagger demultiplexer memory are made to decrease the latency of the block and also the memory size required for optimal operation. Therefore, for the first sub-block of data to be read from MA0, data sub-block A0 is retrieved, while data sub-block A3 is being written concurrently. Specifically, a read operation must happen before a write operation is performed, for the entire duration of the sub-block. The retrieval from subsequent sub-blocks follows the order of data blocks in Data Streams (7), concurrently reading an MA and MB block in sequence, until the last MB2 is reached at T=11. The Data In, B5, is passed directly to the subcore. Specifically, the write into MB2 must happen before a read operation from MB2. For all remaining sub-blocks, there is no contention between reads and writes.

Since each sub-block has the same size and is written and read sequentially into the memory, one soft byte at a time, the memory address of each MA or MB memory sub-block is a repetitive counter, which counts from 0 to the size-1 of the sub, block, equal to 26×207−1, continuously.

The overall size and latency of this processor are the minimal necessary to perform the operation of generating Data Streams (7) from Data Stream (8).

Although the arrangement has been described in terms of exemplary embodiments, it is not limited thereto. Rather, the appended claims should be construed broadly to include other variants and embodiments of the arrangement which may be made by those skilled in the art without departing from the scope and range of equivalents of the arrangement. This disclosure is intended to cover any adaptations or variations of the embodiments discussed herein.

The invention claimed is:

1. An apparatus for processing a first and a second stream of digital data, each stream of digital data including data blocks, the apparatus comprising:
 a stagger multiplexer that processes the first and the second streams of digital data concurrently to output a combined stream of digital data; and
 a stagger demultiplexer that processes the combined stream of digital data to output a first and a second stream of extrinsic digital data, wherein data blocks of the first stream of extrinsic digital data include alternating groups of information blocks and zero blocks and data blocks of the second stream of extrinsic digital data include alternating groups of parity blocks and zero blocks.

2. The apparatus of claim 1, wherein the stagger multiplexer comprises:
 a first memory that processes the first stream of digital data; and
 a second memory that processes the second stream of digital data;

wherein each memory includes M memory blocks, each memory block including N words, each word including B bits and the first and second streams of digital data are processed concurrently.

3. The apparatus of claim 2, wherein the first and the second streams of digital data include groups of 2*M data blocks and the combined stream of digital data includes groups of 2*M data blocks.

4. The apparatus of claim 3, wherein the first memory writes data blocks received from the first stream of digital data to memory blocks and the second memory writes data blocks received from the second stream of digital data to memory blocks concurrently, each data block written at a rate of one data block per time interval T.

5. The apparatus of claim 4, wherein each of the first memory and second memory writes data blocks to their respective memory blocks by continuously rotating through their respective M memory blocks.

6. The apparatus of claim 4, wherein the combined stream of digital data is generated by alternately extracting data blocks from the memory blocks of the first memory and the memory blocks of the second memory, starting with the first memory.

7. The apparatus of claim 6, wherein each of the first memory and second memory extracts data blocks from their respective memory blocks by continuously rotating through their respective M memory blocks.

8. The apparatus of claim 6, wherein the extracting of a first data block from the first memory is performed after a first word of a first data block is written to the first memory.

9. The apparatus of claim 1, wherein the stagger demultiplexer comprises:
a first memory and a second memory that process the combined stream of digital data;
wherein each memory includes M memory blocks, each memory block including N words, each word including B bits and the first and second output streams of digital data are processed concurrently.

10. The apparatus of claim 9, wherein the first and second memory alternately write data blocks received from the combined stream to their respective memory blocks, starting with the first memory, the data blocks being written at a rate of one data block to the first memory and one data block to the second memory per time period T.

11. The apparatus of claim 10, wherein each of the first memory and second memory writes data blocks to their respective memory blocks by continuously rotating through their respective M memory blocks.

12. The apparatus of claim 10, wherein the first stream of extrinsic digital data and the second stream of extrinsic digital data are generated concurrently, by extracting data blocks from the memory blocks of the first memory to generate the first stream of extrinsic digital data and extracting data blocks from the memory blocks of the second memory to generate the second stream of extrinsic digital data.

13. The apparatus of claim 12, wherein each of the first memory and second memory extracts data blocks from their respective memory blocks by continuously rotating through their respective M memory blocks.

14. The apparatus of claim 12, wherein the extracting of a first data block from the first memory and the extracting of a first data block from the second memory are performed after the respective Mth memory blocks of the first and second memory are written to.

\* \* \* \* \*